(12) United States Patent
Kim et al.

(10) Patent No.: US 10,699,983 B2
(45) Date of Patent: Jun. 30, 2020

(54) SEMICONDUCTOR PACKAGE

(71) Applicant: SAMSUNG ELECTRONICS CO., LTD., Suwon-si, Gyeonggi-do (KR)

(72) Inventors: Kil-soo Kim, Hwaseong-si (KR);
Yong-hoon Kim, Suwon-si (KR);
Hyun-ki Kim, Asan-si (KR);
Kyung-suk Oh, Seongnam-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 16/190,825

(22) Filed: Nov. 14, 2018

(65) Prior Publication Data
US 2019/0295917 A1 Sep. 26, 2019

(30) Foreign Application Priority Data
Mar. 22, 2018 (KR) .................. 10-2018-0033494

(51) Int. Cl.
*H01L 23/433* (2006.01)
*H01L 23/60* (2006.01)
*H01L 25/065* (2006.01)
*H01L 23/373* (2006.01)
*H01L 23/367* (2006.01)
*H01L 23/552* (2006.01)
(Continued)

(52) U.S. Cl.
CPC ........ *H01L 23/367* (2013.01); *H01L 23/3128* (2013.01); *H01L 23/552* (2013.01); *H01L 24/16* (2013.01); *H01L 24/32* (2013.01); *H01L 24/48* (2013.01); *H01L 24/73* (2013.01); *H01L 25/0652* (2013.01); *H01L 2224/16227* (2013.01); *H01L 2224/32221* (2013.01); *H01L 2224/48227* (2013.01); *H01L 2224/73253* (2013.01); *H01L 2224/73265* (2013.01); *H01L 2225/0651* (2013.01); *H01L 2225/06517* (2013.01)

(58) Field of Classification Search
None
See application file for complete search history.

(56) References Cited

U.S. PATENT DOCUMENTS 5,818,107 A * 10/1998 Pierson ............... H01L 25/0657
257/723
7,361,986 B2 4/2008 Yuan et al.
(Continued)

FOREIGN PATENT DOCUMENTS

KR 10-2011-0008824 A 1/2011
KR 10-1099577 B1 12/2011

*Primary Examiner* — Herve-Louis Y Assouman
(74) *Attorney, Agent, or Firm* — Lee IP Law, PC

(57) ABSTRACT

A semiconductor package includes a package substrate, a lower semiconductor chip on the package substrate, a heat emission member on the lower semiconductor chip, the heat emission member having a horizontal unit and a vertical unit connected to the horizontal unit, a first semiconductor chip stack and a second semiconductor chip stack on the horizontal unit, and a molding member that surrounds the lower semiconductor chip, the first and second semiconductor chip stacks, and the heat emission member. The vertical unit may be arranged between the first semiconductor chip stack and the second semiconductor chip stack, and an upper surface of the vertical unit may be exposed in the molding member.

17 Claims, 17 Drawing Sheets

(51) Int. Cl.
*H01L 23/00* (2006.01)
*H01L 23/31* (2006.01)

(56) References Cited

U.S. PATENT DOCUMENTS

| | | | |
|---|---|---|---|
| 7,928,562 B2 | 4/2011 | Arvelo et al. | |
| 8,981,554 B2 | 3/2015 | Kim | |
| 9,082,633 B2 | 7/2015 | Grant | |
| 9,177,942 B2 | 11/2015 | Kim et al. | |
| 2006/0113663 A1* | 6/2006 | Yuan | H01L 23/4334 257/718 |
| 2007/0096335 A1* | 5/2007 | Kwon | H01L 23/552 257/777 |
| 2007/0163763 A1* | 7/2007 | Tsai | H01L 23/367 165/135 |
| 2011/0018119 A1 | 1/2011 | Kim et al. | |
| 2014/0340849 A1* | 11/2014 | Kim | H01L 23/34 361/717 |

* cited by examiner

SEMICONDUCTOR PACKAGE

CROSS-REFERENCE TO RELATED APPLICATION

Korean Patent Application No. 10-2018-0033494, filed on Mar. 22, 2018, in the Korean Intellectual Property Office, and entitled: "Semiconductor Package," is incorporated by reference herein in its entirety.

BACKGROUND

1. Field

Embodiments relate to a semiconductor package.

2. Description of the Related Art

Recently, in the electronic product market, demand for mobile phones is rapidly increasing. Therefore, electronic parts mounted in electronic products are desired to be small and light

SUMMARY

Embodiments are directed to a semiconductor package, including a package substrate, a lower semiconductor chip on the package substrate, a heat emission member on the lower semiconductor chip, the heat emission member having a horizontal unit and a vertical unit connected to the horizontal unit, a first semiconductor chip stack and a second semiconductor chip stack on the horizontal unit, and a molding member that surrounds the lower semiconductor chip, the first and second semiconductor chip stacks, and the heat emission member. The vertical unit may be arranged between the first semiconductor chip stack and the second semiconductor chip stack, and an upper surface of the vertical unit may be exposed in the molding member.

Embodiments are also directed to a semiconductor package, including a package substrate, a lower semiconductor chip on the package substrate, a heat emission member on the lower semiconductor chip, the heat emission member having a horizontal unit and a vertical unit connected to the horizontal unit, a first semiconductor chip stack and a second semiconductor chip stack arranged on the horizontal unit, a molding member that surrounds the lower semiconductor chip, the first and second semiconductor chip stacks, and the heat emission member, and an electromagnetic wave shielding member that covers a side surface of the package substrate and a surface of the molding member. The vertical unit may be arranged between the first semiconductor chip stack and the second semiconductor chip stack, and an upper surface of the vertical unit may be exposed in the molding member and contact the electromagnetic wave shielding member.

Embodiments are also directed to a semiconductor package, including a package substrate, a processor chip on the package substrate, a heat emission member on the processor chip, the heat emission member having a horizontal unit and a vertical unit connected to the horizontal unit, a first memory chip stack and a second memory chip stack on the heat emission member, and a molding member that surrounds the processor chip, the first and second memory chip stacks, and the heat emission member. The vertical unit may be between the first memory chip stack and the second memory chip stack, an upper surface of the vertical unit may be exposed in the molding member, and another package substrate may not be arranged between the processor chip and the first and second memory chip stacks.

BRIEF DESCRIPTION OF THE DRAWINGS

Features will become apparent to those of skill in the art by describing in detail example embodiments with reference to the attached drawings in which.

DETAILED DESCRIPTION

Figure 1:
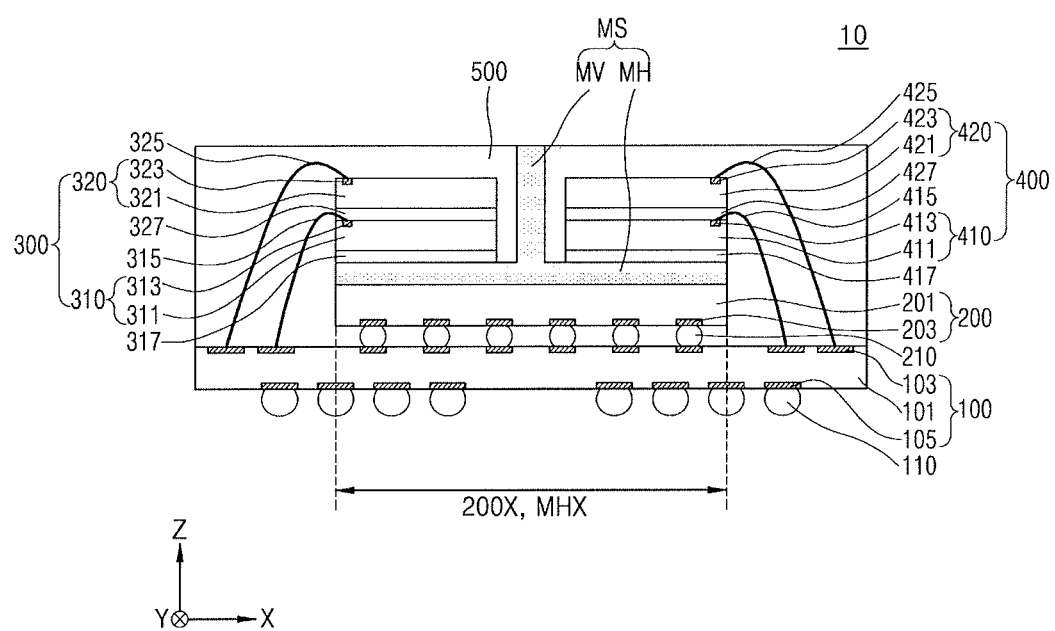
FIG. 1 illustrates a cross-sectional view of a semiconductor package according to an example embodiment.
Figure 2:
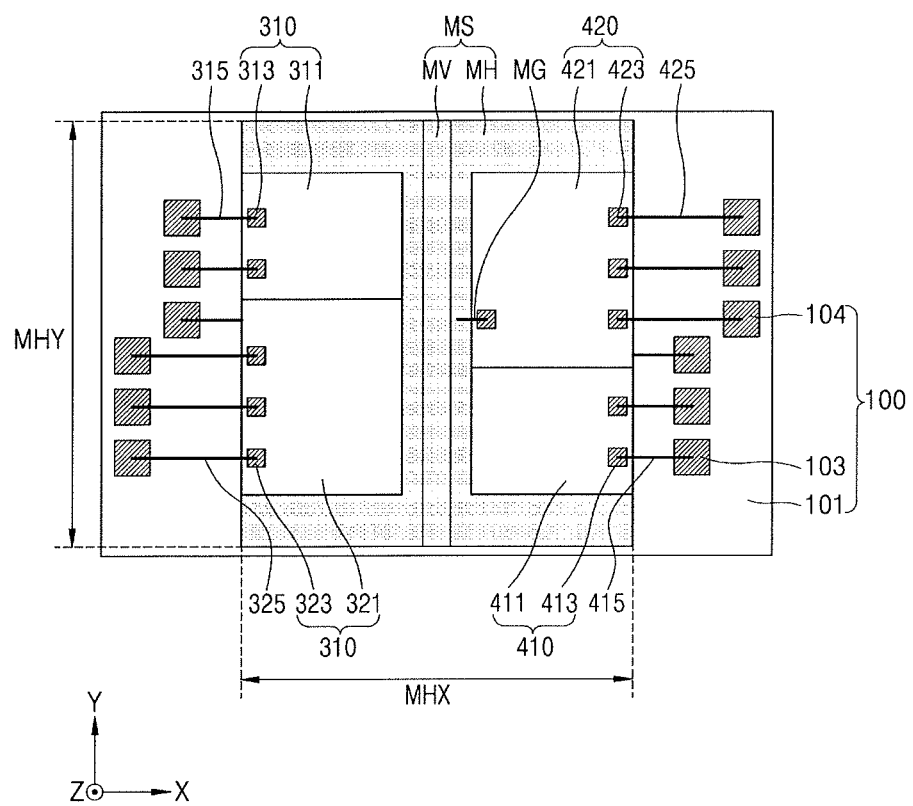
FIG. 2 illustrates a plan view of a semiconductor package.
Figure 3:
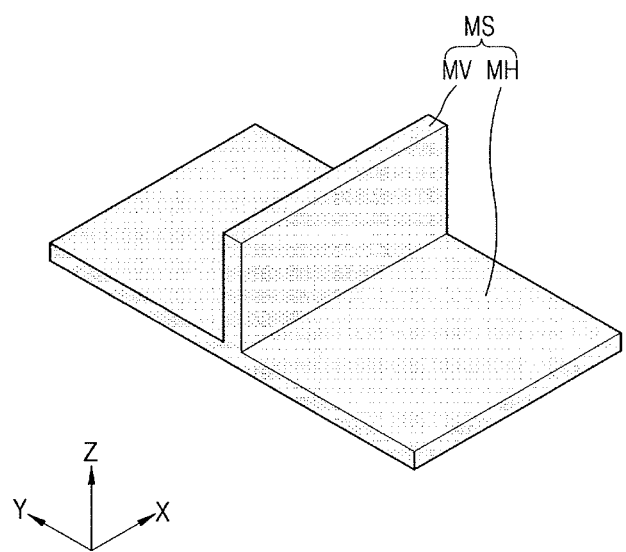
FIG. 3 illustrates a perspective view of a heat emission member.

FIG. 1 illustrates a cross-sectional view of a semiconductor package 10 according to an example embodiment. FIG. 2 illustrates a plan view of the semiconductor package 10. FIG. 3 illustrates a perspective view of a heat emission member MS.

Referring to FIGS. 1 to 3, in an example embodiment, the semiconductor package 10 may include a package substrate 100, a lower semiconductor chip 200 mounted on the package substrate 100, the heat emission member MS arranged on the lower semiconductor chip 200, first and second semiconductor chip stacks 300 and 400 arranged on the heat emission member MS, and a molding member 500.

The package substrate 100 may include a body 101, upper substrate pads 103 on an upper surface of the body 101, and lower substrate pads 105 under a lower surface of the body 101. The package substrate 100 may have a substrate connection via for electrically connecting internal wiring lines and the upper substrate pads 103 to the lower substrate pads 105. Some of the upper substrate pads 103 and the lower substrate pads 105 may be ground pads 104.

The package substrate 100 may be, for example, a printed circuit board (PCB), etc.

The package substrate 100 may be formed of one or more of a phenol resin, an epoxy resin, and polyimide. The package substrate 100 may include one or more of, for example, FR4, tetrafunctional epoxy, polyphenylene ether, epoxy/polyphenylene oxide, bismaleimidetriazine, thermount, cyanate ester, polyimide, and liquid crystal polymer. The upper substrate pads 103, the lower substrate pads 105, the internal wiring lines, the substrate connection via may be formed of, for example, one or more of copper (Cu), Nickel (Ni), aluminum (Al), or beryllium (Be), e.g., beryllium copper.

External connection terminals 110 may be formed on the lower substrate pads 105 of the package substrate 100. The external connection terminals 110 may include, for example, solder balls, conductive bumps, conductive paste, ball grid arrays (BGA), land grid arrays (LGA), pin grid arrays (PGA), or a combination of the above materials. In an example embodiment, the external connection terminals 110 may be omitted.

The semiconductor package 10 according to the present example embodiment may be a system in package. In this case, another package substrate excluding the package substrate 100 may not be arranged between the lower semiconductor chip 200 and the first and second semiconductor chip stacks 300 and 400. Thus, the semiconductor package 10 may include only the package substrate 100.

The lower semiconductor chip 200 may be a processor chip. The lower semiconductor chip 200 may be implemented by, for example, a microprocessor, a graphics processor, a signal processor, a network processor, a chipset, an audio codec, a video codec, an application processor, a system on chip, etc. The microprocessor may include, for example, a single core or multicores.

The lower semiconductor chip 200 may have an active surface and a non-active surface that faces the active surface in the semiconductor substrate 201. The active surface of the lower semiconductor chip 200 may face an upper surface of the package substrate 100. A plurality of active/passive elements and lower semiconductor chip pads 203 may be formed on the active surface of the lower semiconductor chip 200. Internal connection terminals 210 may be formed between the package substrate 100 and the active surface of the lower semiconductor chip 200. The internal connection terminals 210 may include solder balls, conductive bumps, conductive paste, or the combination of the above materials. The lower semiconductor chip pads 203 and the upper substrate pads 103 may respectively contact the internal connection terminals 210. The lower semiconductor chip 200 may be electrically connected to the package substrate 100 through the internal connection terminals 210.

The heat emission member MS may include a horizontal unit MH and a vertical unit MV. The horizontal unit MH may have a horizontal width that is greater than a vertical height thereof, and the vertical unit MV may have a vertical height that is greater than a horizontal width thereof. The horizontal unit MH may be arranged between the lower semiconductor chip 200 and the first and second semiconductor chip stacks 300 and 400. The vertical unit MV may be arranged between the first semiconductor chip stack 300 and the second semiconductor chip stack 400. The vertical unit MV may have a vertical height that is greater than the first and second semiconductor chip stacks 300 and 400. In the heat emission member MS, the horizontal unit MH and the vertical unit MV may be integrated with each other.

The heat emission member MS may be formed of a conductive material. The heat emission member MS may be a metal including, for example, Cu, Al, titanium (Ti), tantalum (Ta), tungsten (W), nickel (Ni), or a combination of the above metals, metal paste including the metal, or a metal tape including the metal.

The heat emission member MS may emit heat generated by the lower semiconductor chip 200 to the outside. The horizontal unit MH may transmit the heat generated by the lower semiconductor chip 200 to the vertical unit MV.

The heat generated by the lower semiconductor chip 200 may be emitted to the outside of the semiconductor package 10 through the heat emission member MS. For this, an upper surface of the vertical unit MV may be exposed by the molding member 500. Thus, the molding member 500 may not cover the upper surface of the vertical unit MV. The heat emission member MS may prevent the heat generated by the lower semiconductor chip 200 from being transmitted to the first and second semiconductor chip stacks 300 and 400.

The first semiconductor chip stack 300 may include a plurality of memory chips, for example, first and second memory chips 310 and 320, and the second semiconductor chip stack 400 may include a plurality of memory chips, for example, third and fourth memory chips 410 and 420.

The first semiconductor chip stack 300 may include the first semiconductor chip 310 and the second semiconductor chip 320 mounted on the left of the horizontal unit MH of the heat emission member MS. The second semiconductor chip 320 may be vertically stacked on the first semiconductor chip 310. The first semiconductor chip 310 may be electrically connected to the package substrate 100 by a first bonding wire 315, and the second semiconductor chip 320 may be electrically connected to the package substrate 100 by a second bonding wire 325.

The second semiconductor chip stack 400 may include the third semiconductor chip 410 and the fourth semiconductor chip 420 mounted on the right of the horizontal unit MH of the heat emission member MS. The fourth semiconductor chip 420 may be vertically stacked on the third semiconductor chip 410. The third semiconductor chip 410 may be electrically connected to the package substrate 100 by a third bonding wire 415, and the fourth semiconductor chip 420 may be electrically connected to the package substrate 100 by a fourth bonding wire 425.

In other implementations, more or fewer semiconductor chip stacks may be included in the semiconductor package 10.

The first to fourth semiconductor chips 310, 320, 410, and 420 may be volatile memory chips and/or non-volatile memory chips. The volatile memory chips may include, for example, dynamic random access memory (DRAM), static RAM, (SRAM), thyristor RAM (TRAM), zero capacitor RAM (ZRAM), and twin transistor RAM (TTRAM). The non-volatile memory chips may include, for example, flash memory, magnetic RAM (MRAM), spin-transfer torque MRAM (STT-MRAM), ferroelectric RAM (FRAM), phase change RAM (PRAM), resistive RAM (PRAM), nanotube RRAM, polymer RAM, nano floating gate memory, holographic memory, molecular electronics memory, and insulator resistance change memory.

The respective memory chips that configure the first to fourth semiconductor chips 310, 320, 410, and 420 may include semiconductor substrates 311, 321, 411, and 421 having active surfaces and non-active surfaces that face each other, memory devices formed on the active surfaces of the semiconductor substrates 311, 321, 411, and 421 and first to fourth bonding pads 313, 323, 413, and 423 formed on the active surfaces of the semiconductor substrates 311, 321, 411, and 421 and electrically connected to first to fourth bonding wires 315, 325, 415, and 425. The first to fourth semiconductor chips 310, 320, 410, and 420 may each have the same structure.

In a system in package in which a plurality of separate semiconductor chips are integrated with one package, the number of first to fourth semiconductor chips 310, 320, 410, and 420 may vary in accordance with a purpose of the semiconductor package 10. In other implementations, more or fewer semiconductor chips may be included in the semiconductor package 10.

The first to fourth semiconductor chips 310, 320, 410, and 420 may be adhered onto the horizontal unit MH of the heat emission member MS through first to fourth adhesive members 317, 327, 417, and 427, the first and second semiconductor chips 310 and 320 may be adhered to each other, and the third and fourth semiconductor chips 410 and 420 may be adhered to each other and may be stacked.

The first to fourth adhesive members 317, 327, 417, and 427 may be die attach films. A die attach film may have, for example, an inorganic adhesive or a polymer adhesive. The polymer adhesive may be divided into a thermosetting resin and a thermoplastic resin. The thermosetting resin may have a three-dimensional cross-link structure after a monomer is thermoformed and may not be softened even when the thermosetting resin is reheated. The thermoplastic resin may have plasticity by heating, and may have a linear polymer structure. The thermosetting resin and the thermoplastic resin may be mixed with each other and may create a hybrid resin.

Thermal conductivity of a material that forms the first to fourth adhesive members 317, 327, 417, and 427 may be less than thermal conductivity of a material that forms the heat emission member MS. The first and third adhesive members 317 and 417 that directly adhere onto the horizontal unit MH of the heat emission member MS may be formed of a material with thermal conductivity that is less than the thermal conductivities of the second and fourth adhesive members 327 and 427 in order to help prevent heat from being transmitted from the heat emission member MS to the first and third semiconductor chips 310 and 410.

At least a portion of the first semiconductor chip stack 300 may be arranged on the lower semiconductor chip 200 to overlap the lower semiconductor chip 200. In addition, at least a portion of the second semiconductor chip stack 400 may be arranged on the lower semiconductor chip 200 to overlap the lower semiconductor chip 200 in a portion different from the first semiconductor chip stack 300. Thus, in a plane structure of the semiconductor package 10, a plane area of the lower semiconductor chip 200 may be greater than a plane area of the first semiconductor chip stack 300, and the plane area of the lower semiconductor chip 200 may be greater than a plane area of the second semiconductor chip stack 400. The plane area of the lower semiconductor chip 200 may be equal to the plane area of the horizontal unit MH.

The first to fourth bonding wires 315, 325, 415, and 425 may electrically connect the first to fourth semiconductor chips 310, 320, 410, and 420 to the package substrate 100. The first to fourth bonding wires 315, 325, 415, and 425 may separately connect first to fourth bonding pads 313, 323, 413, and 423 of the first to fourth semiconductor chips 310, 320, 410, and 420 to the upper substrate pads 103 of the package substrate 100. In the drawing, for convenience sake, only some of the bonding wires are illustrated.

In addition, a ground bonding wire MG may electrically connect the heat emission member MS to one of first to fourth bonding pads 313, 323, 413, and 423 of the first to fourth semiconductor chips 310, 320, 410, and 420. The first to fourth semiconductor chips 310, 320, 410, and 420 may be electrically connected to the package substrate 100 through the first to fourth bonding wires 315, 325, 415, and 425. Thus, the ground bonding wire MG may electrically connect the heat emission member MS to a ground pad 104 of the package substrate 100. The heat emission member MS may be formed of a conductive material as described above. In this case, if the heat emission member MS is not grounded, then a floating phenomenon could occur. Therefore, the semiconductor package 10 may include the ground bonding wire MG in order to help prevent the floating phenomenon.

The first to fourth bonding wires 315, 325, 415, and 425 and the ground bonding wire MG may include at least one of gold (Au), silver (Ag), Cu, and Al. In an example embodiment, the first to fourth bonding wires 315, 325, 415, and 425 and the ground bonding wire MG may be connected by one method of thermocompression connection and ultrasonic connection or thermosonic connection obtained by combining the thermocompression connection and the ultrasonic connection.

In an example embodiment, the first to fourth semiconductor chips 310, 320, 410, and 420 that configure the first and second semiconductor chip stacks 300 and 400 may be aligned to be shifted in a Y direction and to go across. The first to fourth semiconductor chips 310, 320, 410, and 420 may be vertically aligned. Some of the first to fourth bonding wires 315, 325, 415, and 425 may be formed to pass through the inside of one of the second and fourth adhesive members 327 and 427.

In an example embodiment, a first width MHX in an X direction of the horizontal unit MH that faces a direction in which the first to fourth bonding wires 315, 325, 415, and 425 are formed may be less than a second width MHY in a Y direction of the horizontal unit MH in a direction in which the first to fourth bonding wires 315, 325, 415, and 425 are not formed. Thus, the heat emission member MS may be designed so that lengths of the first to fourth bonding wires 315, 325, 415, and 425 are minimized while maximizing the plane area of the horizontal unit MH.

The molding member 500 may surround the lower semiconductor chip 200, the first and second semiconductor chip stacks 300 and 400, and the heat emission member MS, and may protect the lower semiconductor chip 200, the first and second semiconductor chip stacks 300 and 400, and the heat emission member MS against an external environment.

Molding resin may be injected onto the package substrate 100 by an injection process and the appearance of the semiconductor package 10 may be formed through a hardening process so that the molding member 500 is obtained. The appearance of the semiconductor package 10 may be formed by applying pressure to the molding resin in a pressure process using a press. Process conditions such as delay time between the molding resin injection and pressure, an amount of injected molding resin, and a pressure temperature/pressure may be set considering a physical property such as viscosity of the molding resin.

In an example embodiment, the molding resin may include an epoxy-group molding resin or a polyimide-group molding resin. The molding member 500 may be formed of, for example, an epoxy molding compound (EMC) or a high-K epoxy molding compound. Thermal conductivity of a material that forms the molding member 500 may be less than thermal conductivity of a material that forms the heat emission member MS.

The molding member 500 may protect the lower semiconductor chip 200 and the first and second semiconductor chip stacks 300 and 400 against an external influence such as contamination and shock. A thickness of the molding member 500 may be formed to surround all of the lower semiconductor chip 200 and the first and second semiconductor chip stacks 300 and 400. The molding member 500 may completely cover the package substrate 100. Thus, a width of the molding member 500 may be equal to a width of the semiconductor package 10. The molding member 500 may expose an upper surface of the vertical unit MV of the heat emission member MS to the outside. Thus, the molding member 500 may not cover the upper surface of the vertical unit MV.

Demand for portable devices is rapidly increasing. Therefore, electronic parts mounted in the electronic products are desired to be small and light. In order to make the electronic parts small and light, semiconductor packages mounted in the electronic parts may have reduced package volumes while processing high capacity data. Semiconductor chips mounted in the semiconductor package are desired to be high density integrated and singly packaged. Therefore, in order to efficiently arrange the semiconductor chips in a limited structure of the semiconductor package, a system in package may be applied. However, in general, a large amount of heat may be generated due to a number of operations. If the generation of heat is not controlled, the performance of the memory chips may be affected.

In the semiconductor package 10 according to the present example embodiment, the heat emission member MS may be arranged to directly contact the lower semiconductor chip 200, which in an implementation is a chip that generates more heat than the first to fourth semiconductor chips 310, 320, 410, and 420. Thus, the semiconductor chips may be efficiently arranged in a limited space structure of the semiconductor package 10 while providing improved heat emission and high density integration.

Figure 4:
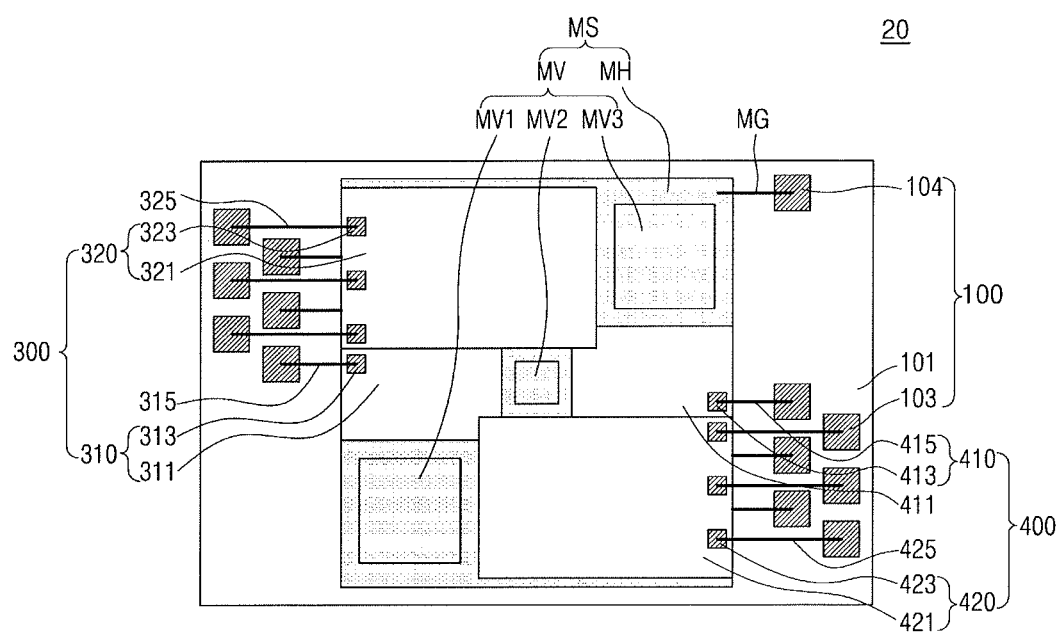
FIG. 4 illustrates a plan view of a semiconductor package according to an example embodiment.
Figure 5:
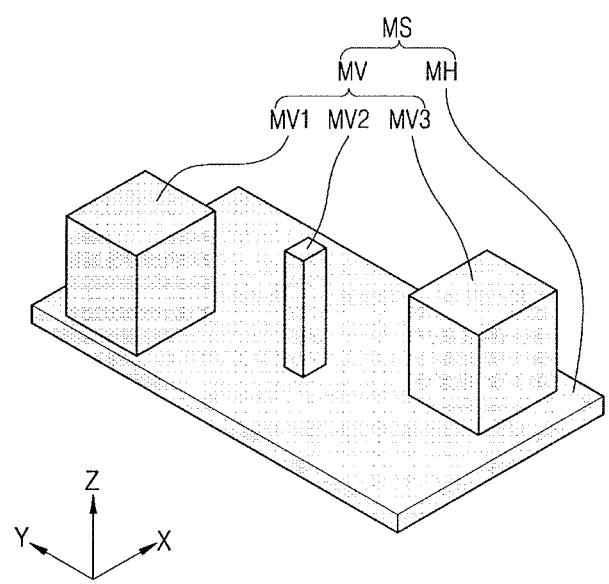
FIG. 5 illustrates a perspective view of a heat emission member.

FIG. 4 illustrates a plan view of a semiconductor package 20 according to an example embodiment. FIG. 5 illustrates a perspective view of a heat emission member MS.

Referring to FIGS. 4 and 5, the semiconductor package 20 may include the package substrate 100, a lower semiconductor chip mounted on the package substrate 100, the heat emission member MS arranged on the lower semiconductor chip, the first and second semiconductor chip stacks 300 and 400 arranged on the heat emission member MS, and a molding member.

The respective elements that configure the semiconductor package 20 and materials that form the elements may be the same as or similar to the elements and the materials described in FIGS. 1 to 3. Thus, the following description will be made mainly with respect to differences. The semiconductor package 20 is illustrated as having a plane structure so that the lower semiconductor chip is not illustrated and the molding member is omitted in order to describe an internal structure of the semiconductor package 20.

In the semiconductor package 20, relative positions of the first and second semiconductor chip stacks 300 and 400 and the vertical unit MV of the heat emission member MS on the package substrate 100 will be described as follows. The first semiconductor chip stack 300 and the second semiconductor chip stack 400 may be arranged so that portions thereof overlap. The vertical unit MV may include a plurality of structures MV1, MV2, and MV3 and may be separate from the first semiconductor chip stack 300 and the second semiconductor chip stack 400. The plurality of structures MV1, MV2, and MV3 may be formed with different sizes in different positions. All vertical heights of the plurality of structures MV1, MV2, and MV3 may be equal to each other.

The ground bonding wire MG may directly electrically connect the heat emission member MS to the ground pad 104 of the package substrate 100 without passing through the first to fourth semiconductor chips 310, 320, 410, and 420, unlike in the semiconductor package 10.

Figure 6:
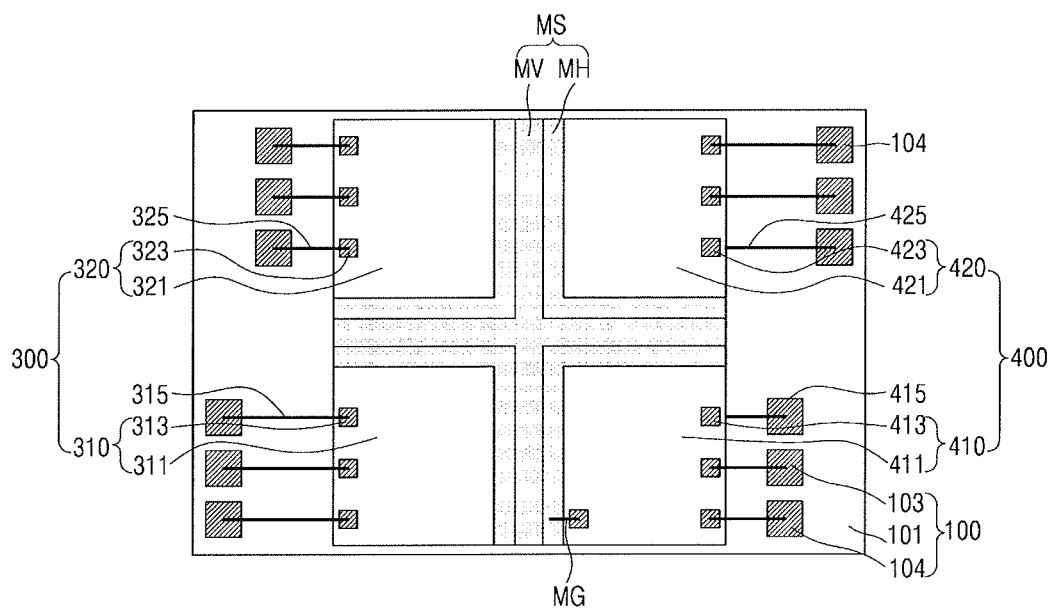
FIG. 6 illustrates a plan view of a semiconductor package according to an example embodiment.
Figure 7:
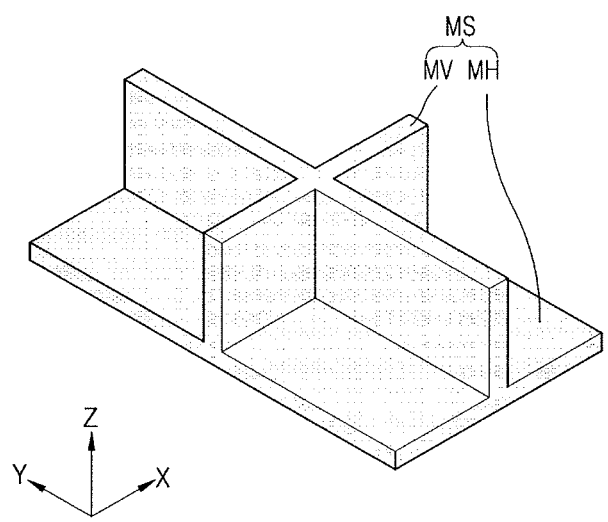
FIG. 7 illustrates a perspective view of a heat emission member.

FIG. 6 illustrates a plan view of a semiconductor package 30 according to an example embodiment. FIG. 7 illustrates a perspective view of a heat emission member MS.

Referring to FIGS. 6 and 7, the semiconductor package 30 may include the package substrate 100, a lower semiconductor chip mounted on the package substrate 100, the heat emission member MS arranged on the lower semiconductor chip, the first to fourth semiconductor chips 310, 320, 410, and 420 arranged on the heat emission member MS, and a molding member.

Respective elements that configure the semiconductor package 30 and materials that form the elements may be the same as or similar to the elements and the materials described in FIGS. 1 to 3. Thus, description will be made mainly of differences. The semiconductor package 30 is illustrated as having a plane structure so that the lower semiconductor chip is not illustrated and the molding member is omitted in order to describe an internal structure of the semiconductor package 30.

In the semiconductor package 30, relative positions of the first to fourth semiconductor chips 310, 320, 410, and 420 and the vertical unit MV of the heat emission member MS on the package substrate 100 will be described as follows. All the first to fourth semiconductor chips 310, 320, 410, and 420 may be separate from each other so as not to overlap each other. The vertical unit MV may partition off the first to fourth semiconductor chips 310, 320, 410, and 420 and may be separate from the first to fourth semiconductor chips 310, 320, 410, and 420. The vertical unit MV may be formed so that a structure that extends in the X and Y directions meets in the center of the horizontal unit MH.

Figure 8:
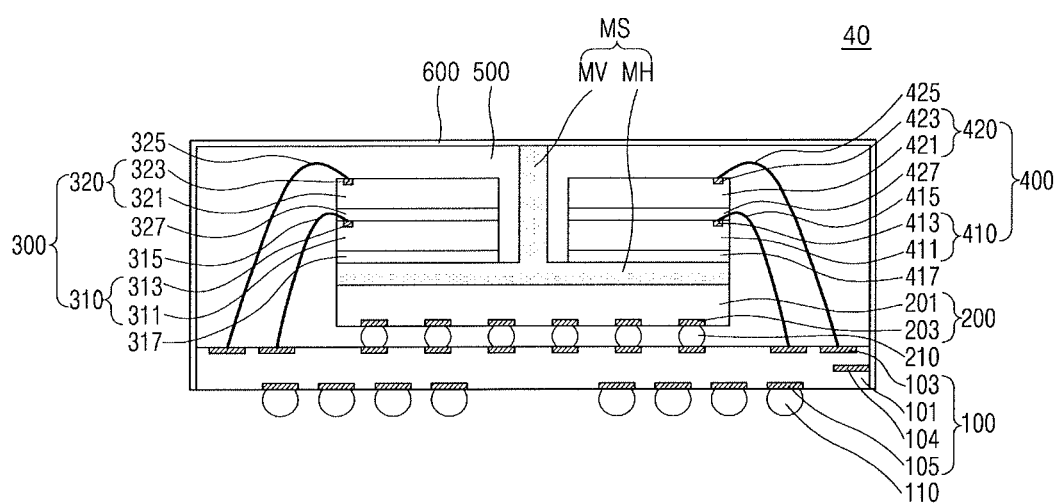
FIGS. 8 to 10 illustrate cross-sectional views of a semiconductor package according to an example embodiment.
Figure 9:
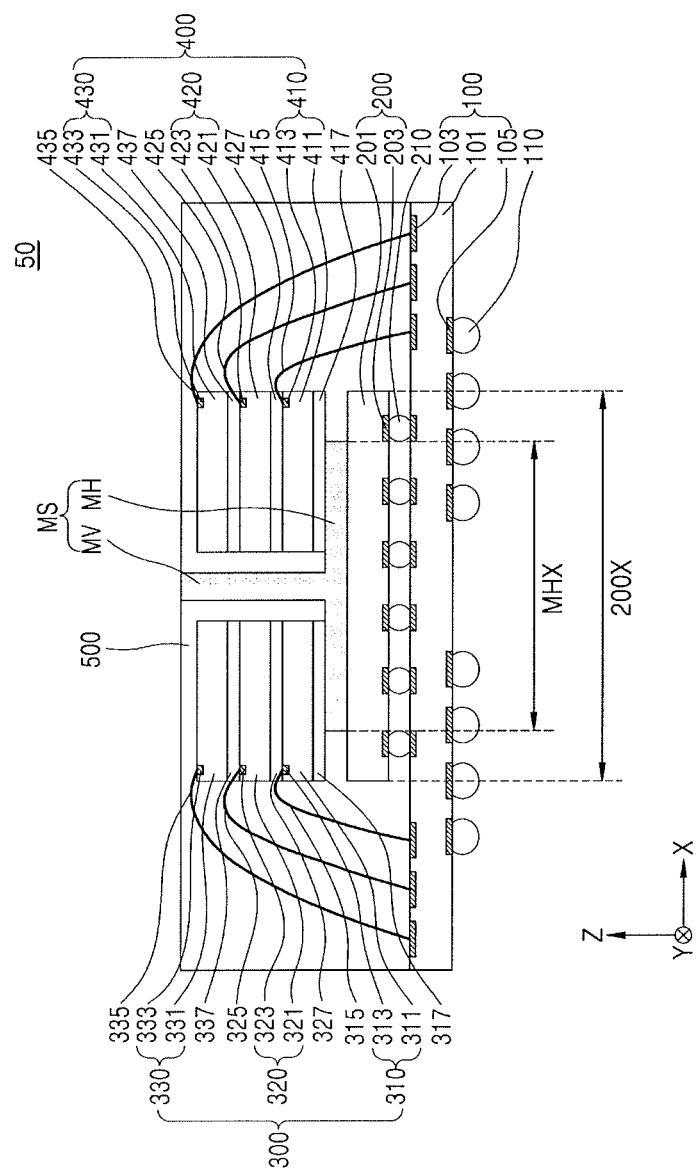
Figure 10:
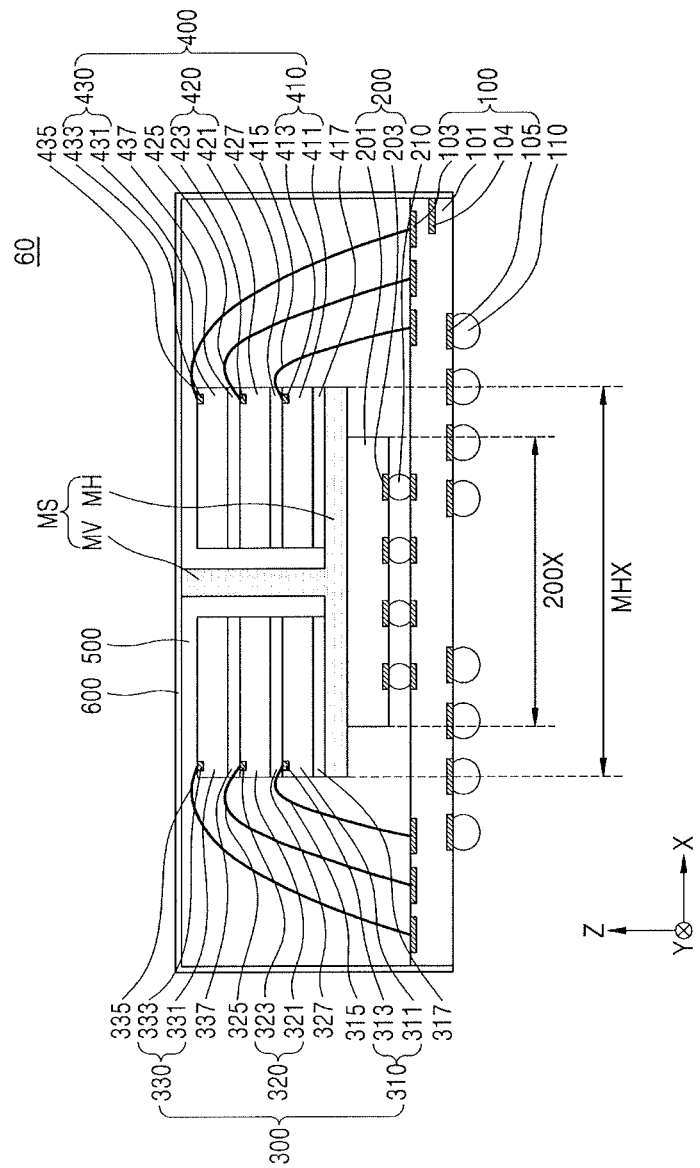

FIGS. 8 to 10 illustrate cross-sectional views of a semiconductor package according to an example embodiment.

Referring to FIG. 8, a semiconductor package 40 may include the package substrate 100, a lower semiconductor chip 200 mounted on the package substrate 100, the heat emission member MS arranged on the lower semiconductor chip 200, the first and second semiconductor chip stacks 300 and 400 arranged on the heat emission member MS, the molding member 500, and an electromagnetic wave shielding member 600.

The respective elements that configure the semiconductor package 40 and materials that form the elements may be the same as or similar to the elements and the materials described in FIGS. 1 to 3. Thus, description will be made mainly of differences.

When the semiconductor package 40 is mounted in an electronic device including a main board, electromagnetic waves generated by the semiconductor package 40 may be emitted and electromagnetic interference (EMI) may affect other electronic parts mounted in the electronic device. Therefore, interference such as electromagnetic wave noise or an erroneous operation may be generated in the electronic device in which the semiconductor package 40 is mounted, which may impact reliability of a product. The electromagnetic wave shielding member 600 may help prevent the electromagnetic waves generated in an operation process of the semiconductor package 40 from affecting the outside.

In order to increase electromagnetic wave shielding effect, the electromagnetic wave shielding member 600 may be electrically connected to the ground pad 104.

The heat emission member MS may be electrically connected to the electromagnetic wave shielding member 600, and the electromagnetic wave shielding member 600 may be electrically connected to the ground pad 104 of the package substrate 100. Therefore, the ground bonding wire MG may be omitted in the semiconductor package 40.

The electromagnetic wave shielding member 600 may include a conductive material. For example, the conductive material may include a metal. The electromagnetic wave shielding member 600 may be formed as a metal thin film. In this case, the metal thin film may be formed by a thin film forming process, for example, a spray coating process, an electroplating process, an electro-less plating process, or a sputtering process.

Referring to FIG. 9, a semiconductor package 50 may include the package substrate 100, a lower semiconductor chip 200 mounted on the package substrate 100, the heat emission member MS arranged on the lower semiconductor chip 200, the first and second semiconductor chip stacks 300 and 400 arranged on the heat emission member MS, and the molding member 500.

Respective elements that configure the semiconductor package 50 and materials that form the elements may be the same as or similar to the elements and the materials described in FIGS. 1 to 3. Thus, description will be made mainly of differences.

The first semiconductor chip stack 300 may include the first semiconductor chip 310, the second semiconductor chip 320, and a fifth semiconductor chip 330 that are mounted on the left of the horizontal unit MH of the heat emission member MS. The second semiconductor chip 320 may be vertically stacked on the first semiconductor chip 310, and the fifth semiconductor chip 330 may be vertically stacked on the second semiconductor chip 320. The first semiconductor chip 310, the second semiconductor chip 320, and the fifth semiconductor chip 330 may be electrically connected to the package substrate 100 by the first bonding wire 315, by the second bonding wire 325, and by a fifth bonding wire 335, respectively.

The second semiconductor chip stack 400 may include the third semiconductor chip 410, the fourth semiconductor chip 420, and a sixth semiconductor chip 430 that are mounted on the right of the horizontal unit MH of the heat emission member MS. The fourth semiconductor chip 420 may be vertically stacked on the third semiconductor chip 410. The sixth semiconductor chip 430 may be vertically stacked on the fourth semiconductor chip 420. The third semiconductor chip 410, the fourth semiconductor chip 420, and the sixth semiconductor chip 430 may be electrically connected to the package substrate 100 by the third bonding wire 415, by the fourth bonding wire 425, and by a sixth bonding wire 435, respectively.

A width 200X in the X direction of the lower semiconductor chip 200 may be greater than a width MHX in the X direction of the horizontal unit MH. Thus, the heat emission member MS may not be formed in a portion of the lower semiconductor chip 200. Thus, the plane area of the lower semiconductor chip 200 may be greater than the plane area of the horizontal unit MH.

Referring to FIG. 10, a semiconductor package 60 may include the package substrate 100, the lower semiconductor chip 200 mounted on the package substrate 100, the heat emission member MS arranged on the lower semiconductor chip 200, the first and second semiconductor chip stacks 300 and 400 arranged on the heat emission member MS, the molding member 500, and the electromagnetic wave shielding member 600.

Respective elements that configure the semiconductor package 60 and materials that form the elements may be the same as or similar to the elements and the materials described in FIG. 9. Thus, description will be made mainly of differences.

The electromagnetic wave shielding member 600 may help prevent electromagnetic waves generated in an operation process of the semiconductor package 60 from affecting the outside. In order to increase the electromagnetic wave shielding effect, the electromagnetic wave shielding member 600 may be electrically connected to the ground pad 104.

The heat emission member MS may be electrically connected to the electromagnetic wave shielding member 600, and the electromagnetic wave shielding member 600 may be electrically connected to the ground pad 104 of the package substrate 100. Therefore, the ground bonding wire MG may be omitted in the semiconductor package 60.

A width 200X in the X direction of the lower semiconductor chip 200 may be less than a width MHX in the X direction of the horizontal unit MH. Thus, in the heat emission member MS, there may be a region that does not contact the lower semiconductor chip 200. Thus, the plane area of the lower semiconductor chip 200 may be less than the plane area of the horizontal unit MH.

FIGS. 11A to 11F illustrate cross-sectional views of stages in a manufacturing process of a semiconductor package according to an example embodiment.

Figure 11A:
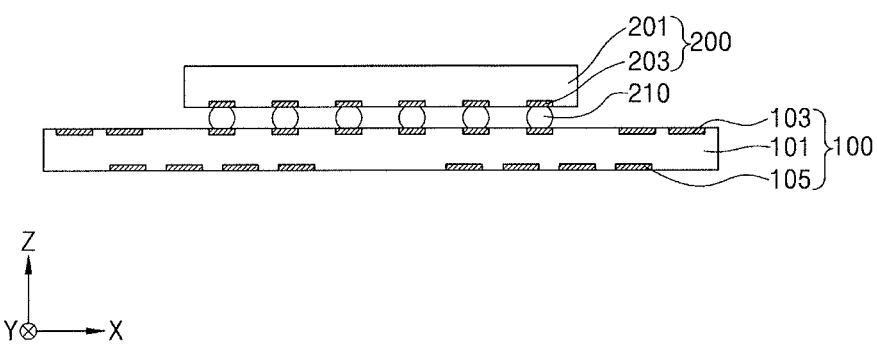
FIGS. 11A to 11F illustrate cross-sectional views of manufacturing processes of a semiconductor package according to an example embodiment.

Referring to FIG. 11A, the lower semiconductor chip 200 may be mounted on a region in which the package substrate 100 is mounted.

The internal connection terminals 210 may be arranged between the package substrate 100 and the lower semiconductor chip 200. The internal connection terminals 210 may include solder balls, conductive bumps, conductive paste, or a combination of the above materials. The lower semiconductor chip 200 may be electrically connected to the package substrate 100 through the internal connection terminals 210.

Figure 11B:
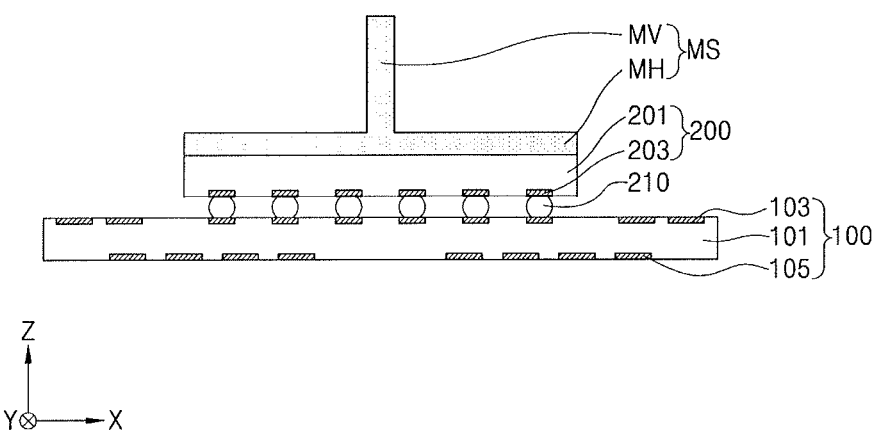

Referring to FIG. 11B, the heat emission member MS may be arranged on the lower semiconductor chip 200 so as to contact the lower semiconductor chip 200.

The heat emission member MS may include the horizontal unit MH and the vertical unit MV. The heat emission member MS may be integral. The heat emission member MS may be formed of a conductive material. The heat emission member MS and the lower semiconductor chip 200 may be separately manufactured. Thus, the heat emission member MS may be previously integrally manufactured and may be arranged on the lower semiconductor chip 200.

Figure 11C:
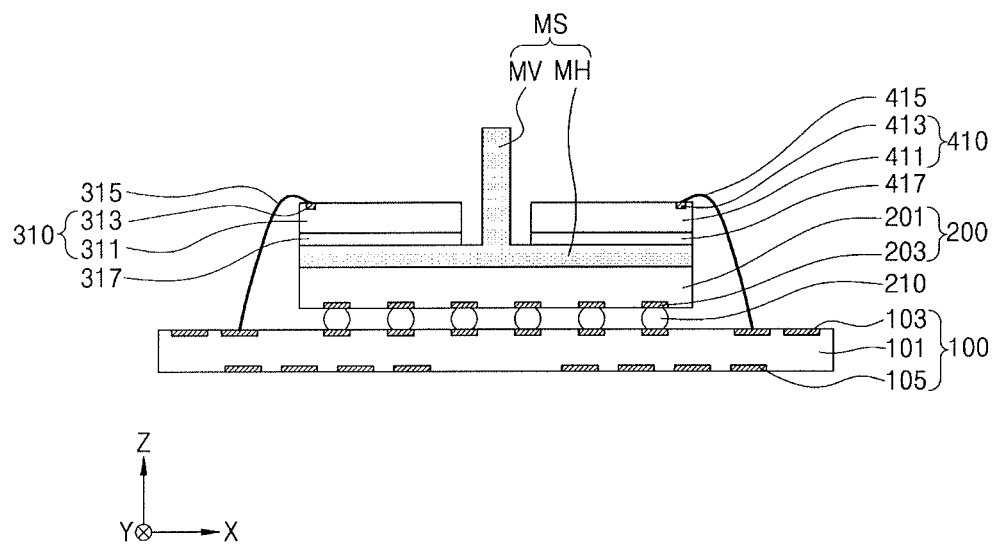

Referring to FIG. 11C, the first and third semiconductor chips 310 and 410 may be arranged on the heat emission member MS, and the first and third semiconductor chips 310 and 410 and the package substrate 100 may be electrically connected by using the first and third bonding wires 315 and 415.

The first and third adhesive members 317 and 417 that directly adhere onto the horizontal unit MH of the heat emission member MS may include a material with low thermal conductivity in order to help prevent heat from being transmitted from the heat emission member MS to the first and third semiconductor chips 310 and 410.

Figure 11D:
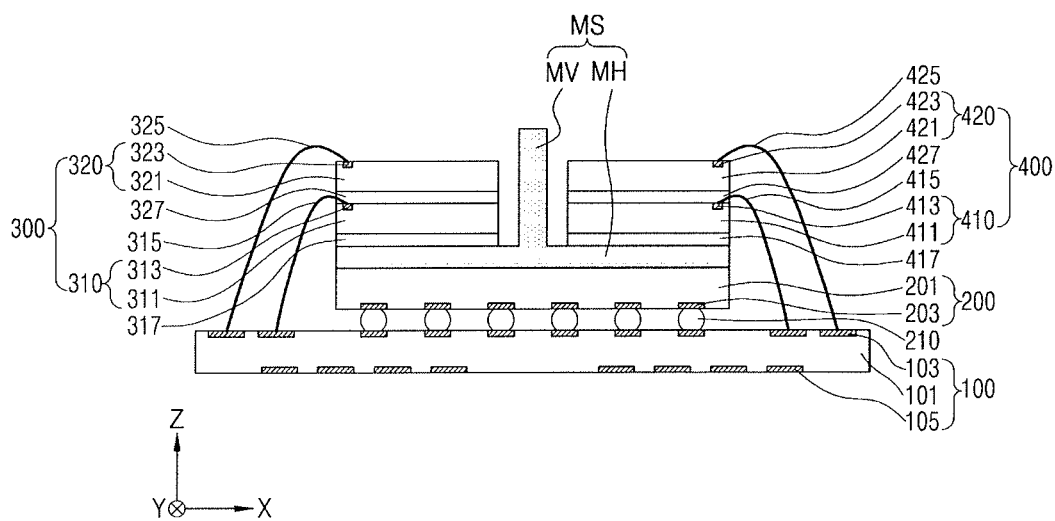

Referring to FIG. 11D, the second and fourth semiconductor chips 320 and 420 may be arranged on the first and third semiconductor chips 310 and 410, and the second and fourth semiconductor chips 320 and 420 and the package substrate 100 may be electrically connected by using the second and fourth bonding wires 325 and 425.

The second and fourth semiconductor chips 320 and 420 may be shifted by a distance in the Y direction and may be stacked on the first and third semiconductor chips 310 and 410 so that the first and third bonding pads 313 and 413 formed in a portion of an upper surface of a semiconductor chip under the second and fourth semiconductor chips 320 and 420 are exposed.

In the system in package in which a plurality of separate elements are integrated with a package, the number of semiconductor chips may vary in accordance with a purpose of the semiconductor package. Thus, more or fewer semiconductor chips may be stacked.

A ground bonding wire may be electrically connected to a ground pad of the package substrate 100 through one of the heat emission member MS and the first to fourth semiconductor chips 310, 320, 410, and 420.

When stacking the first to fourth semiconductor chips 310, 320, 410, and 420 as stairs, a redistribution layer may be formed. In the case in which the first to fourth bonding pads 313, 323, 413, and 423 are positioned in portions of the first to fourth semiconductor chips 310, 320, 410, and 420, when the first to fourth semiconductor chips 310, 320, 410, and 420 are stacked, the semiconductor package may be complicated, and lengths of the first to fourth bonding wires 315, 325, 415, and 425 may increase so that characteristics deteriorate. Thus, positions of the first to fourth bonding pads 313, 323, 413, and 423 may be changed by forming a rewiring line.

Figure 11E:
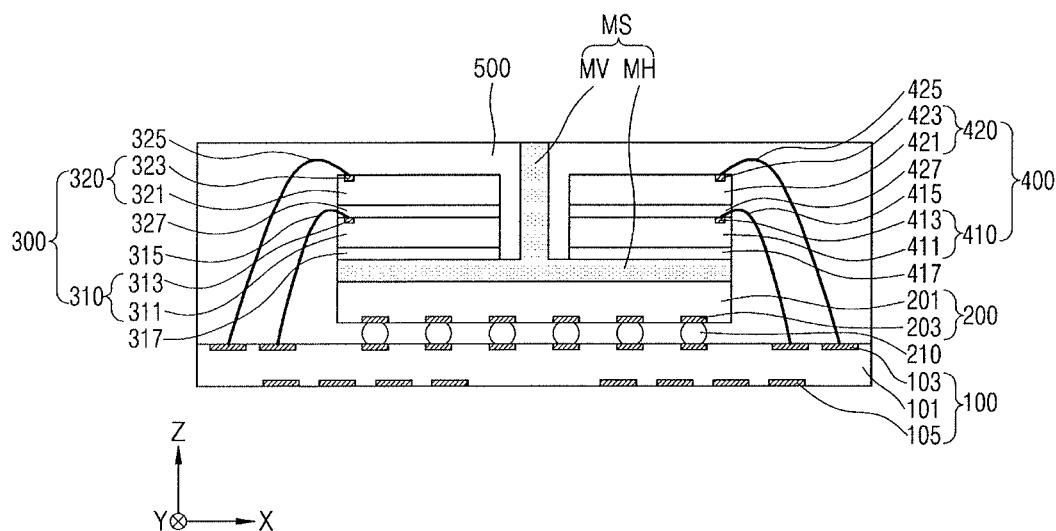

Referring to FIG. 11E, the molding member 500 that covers the lower semiconductor chip 200 and the first and second semiconductor chip stacks 300 and 400 and exposes the upper surface of the vertical unit MV of the heat emission member MS may be formed.

In a general semiconductor package, a molding member may be formed to cover all elements arranged on the upper surface of the package substrate. According to an example embodiment, the molding member 500 is formed to expose the upper surface of the vertical unit MV of the heat emission member MS, which may improve heat emission property as described above.

After performing the above-described processes, the semiconductor package 10 may be manufactured by forming the external connection terminals 110 (refer to FIG. 1) in the package substrate 100.

Figure 11F:
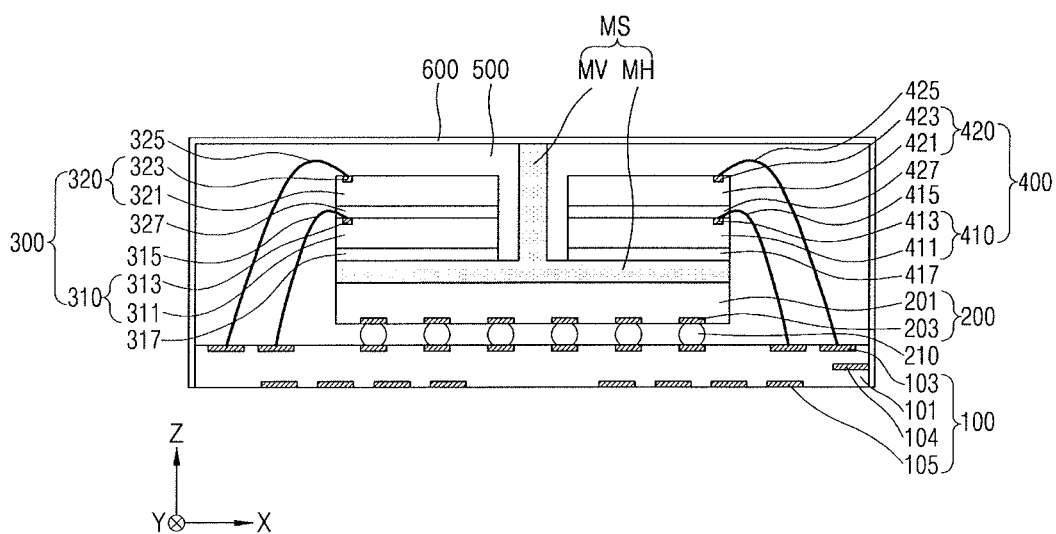

Referring to FIG. 11F, the molding member 500 may be covered with the electromagnetic wave shielding member 600, and the electromagnetic wave shielding member 600 may be electrically connected to the ground pad 104 of the package substrate 100.

The electromagnetic wave shielding member 600 may cover an upper surface of the molding member 500, a side surface of the molding member 500, the upper surface of the vertical unit MV of the heat emission member MS, and a side surface of the package substrate 100. The heat emission member MS may directly contact the electromagnetic wave shielding member 600, and the electromagnetic wave shielding member 600 may directly contact the ground pad 104 of the package substrate 100.

The electromagnetic wave shielding member 600 may be in the form of a metal thin film. In this case, the metal thin film may be formed by the thin film forming process, for example, the spray coating process, the electroplating process, the electro-less plating process, or the sputtering process.

After the above-described process is performed, the semiconductor package 40 may be manufactured by forming the external connection terminals 110 (refer to FIG. 4) on the package substrate 100.

FIGS. 12A to 12F illustrate cross-sectional views of stages in a manufacturing processes of a semiconductor package according to an example embodiment.

Figure 12A:
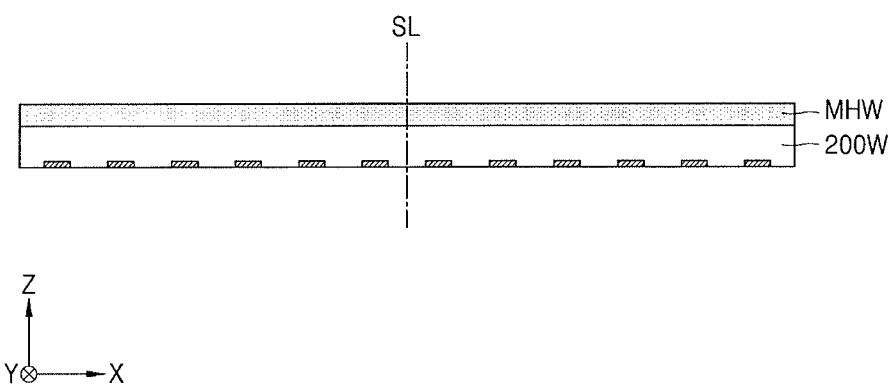
FIGS. 12A to 12F illustrate cross-sectional views of manufacturing processes of a semiconductor package according to an example embodiment.

Referring to FIG. 12A, a stand-by horizontal unit MHW may be formed on a non-active surface of a stand-by lower semiconductor chip 200W.

The stand-by horizontal unit MHW may include a conductive material such as a metal or an alloy, for example, Cu, Al, Ni, Pt, Ag, Au, or a combination of the above metals. The stand-by horizontal unit MHW may be formed by the thin film forming process, for example, the spray coating process, the electroplating process, the electro-less plating process, the sputtering process, or a metal tape adhesive process.

The stand-by lower semiconductor chip 200W and the stand-by horizontal unit MHW may be cut in a scribe lane SL and may be physically separated from each other so that the lower semiconductor chip 200 (refer to FIG. 12B) (in which the horizontal unit MH (refer to FIG. 12B) is formed) is formed.

Figure 12B:
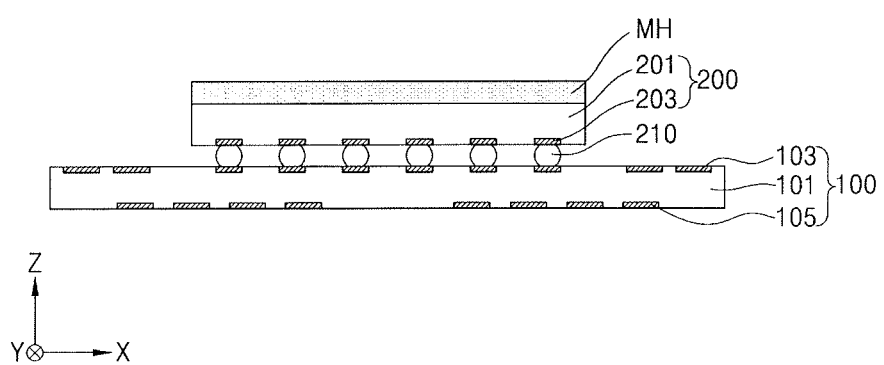

Referring to FIG. 12B, the lower semiconductor chip 200 in which the horizontal unit MH is formed may be mounted on the package substrate 100.

The internal connection terminals 210 may be arranged between the package substrate 100 and the lower semiconductor chip 200 in which the horizontal unit MH is formed. The internal connection terminals 210 may include solder balls, conductive bumps, conductive paste, or a combination of the above materials. The lower semiconductor chip 200 in which the horizontal MH is formed may be electrically connected to the package substrate 100 through the internal connection terminals 210.

Figure 12C:
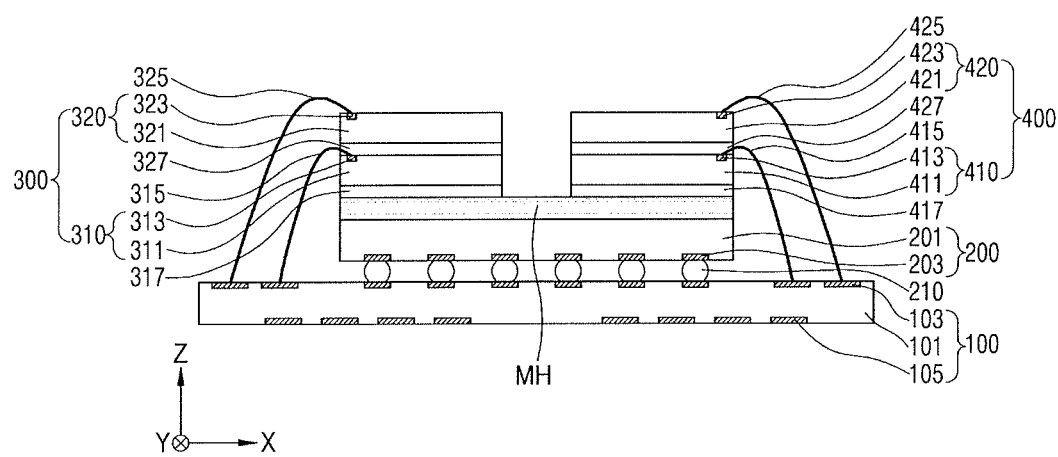

Referring to FIG. 12C, the first and second semiconductor chip stacks 300 and 400 may be arranged on the horizontal unit MH.

The first and third adhesive members 317 and 417, which may directly adhere onto the horizontal unit MH, may include a material with low thermal conductivity in order to help prevent heat from being transmitted from the heat emission member MS to the first and third semiconductor chips 310 and 410.

The second and fourth semiconductor chips 320 and 420 may be shifted by a distance in a direction horizontal to the package substrate 100 and may be stacked on the first and third semiconductor chips 310 and 410 so that the first and third bonding pads 313 and 413 (formed in a portion of an upper surface of a semiconductor chip under the second and fourth semiconductor chips 320 and 420) are exposed.

A ground bonding wire may be electrically connected a ground pad of the package substrate 100 through one of the heat emission member MS and the first to fourth semiconductor chips 310, 320, 410, and 420.

Figure 12D:
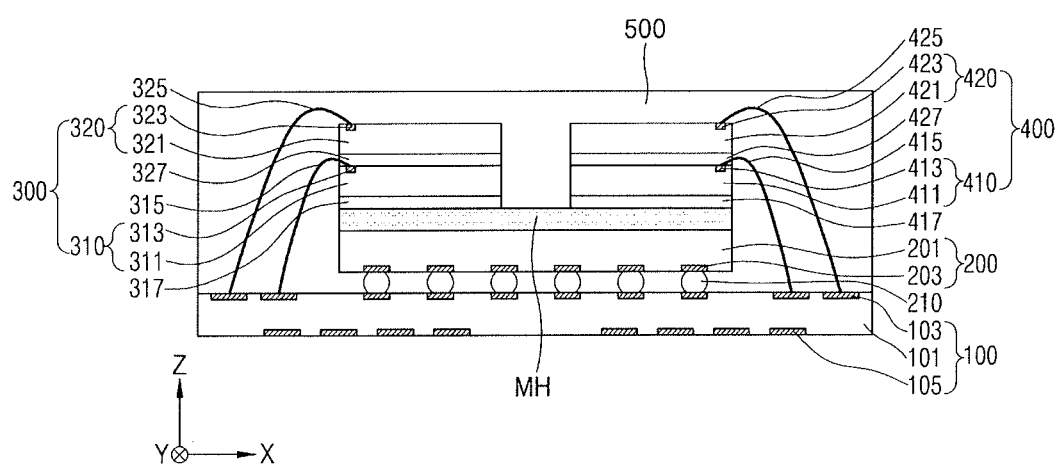

Referring to FIG. 12D, the molding member 500 may be formed to cover the lower semiconductor chip 200 and the first and second semiconductor chip stacks 300 and 400.

Unlike in the above-described manufacturing processes, a vertical unit NV (refer to FIG. 12F) may not be formed. Thus, the molding member 500 may cover all the elements arranged on the upper surface of the package substrate 100.

Figure 12E:
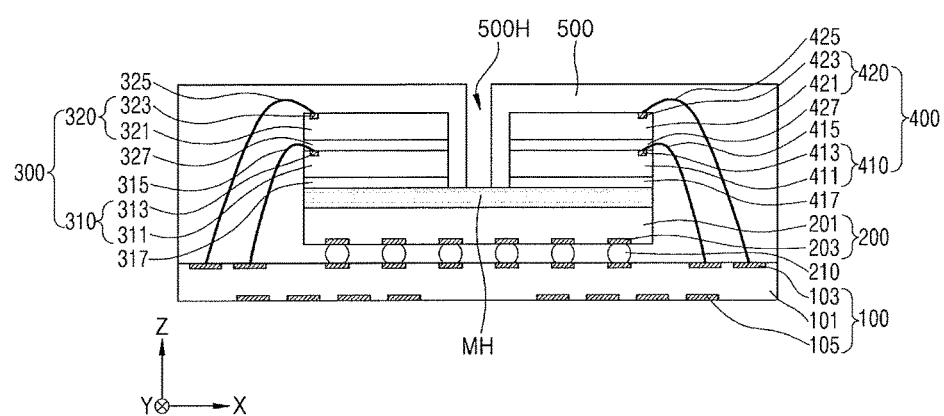

Referring to FIG. 12E, a molding opening 500H that exposes a portion of the horizontal unit MH may be formed in the molding member 500.

The molding opening 500H may be formed by removing a portion of the molding member 500. The molding opening 500H may be formed by, for example, a drilling process. When there is no horizontal unit MH, the lower semiconductor chip 200 may be damaged by the drilling. A lowermost surface of the molding opening 500H may have a level that is higher than an uppermost surface of the lower semiconductor chip 200. The horizontal unit MH may be formed on the lower semiconductor chip 200. Thus, damage to the lower semiconductor chip 200 may be avoided.

Figure 12F:
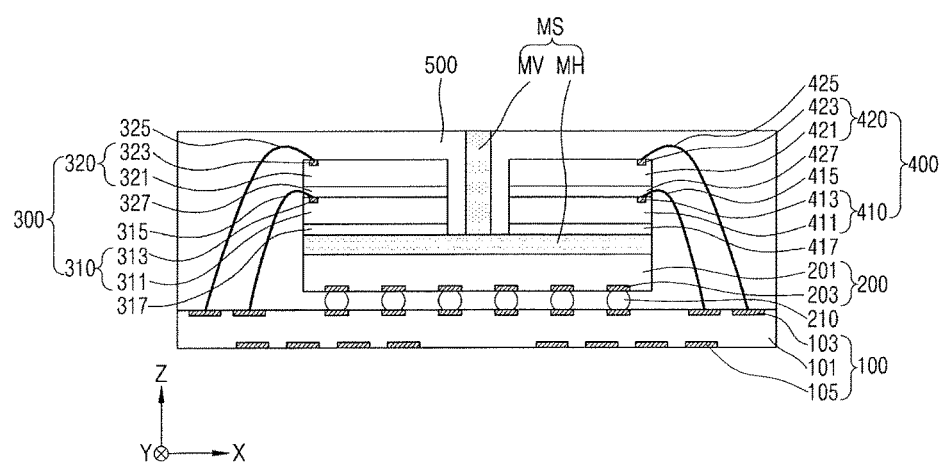

Referring to FIG. 12F, the vertical unit NV may be formed in the molding opening 500H, and the heat emission member MS may be formed to contact the horizontal unit MH.

In an example embodiment, a conductive material such as a metal and adhesive polymer may be filled in the molding opening 500H. The vertical unit NV and the horizontal unit MH may be formed of the same material. The vertical unit NV may be connected to the horizontal unit MH and may form the heat emission member MS. Thus, the heat emission member MS may not be integral.

After performing the above process, the semiconductor package 10 may be manufactured by forming the external connection terminals 110 (refer to FIG. 1) on the package substrate 100.

Figure 13:
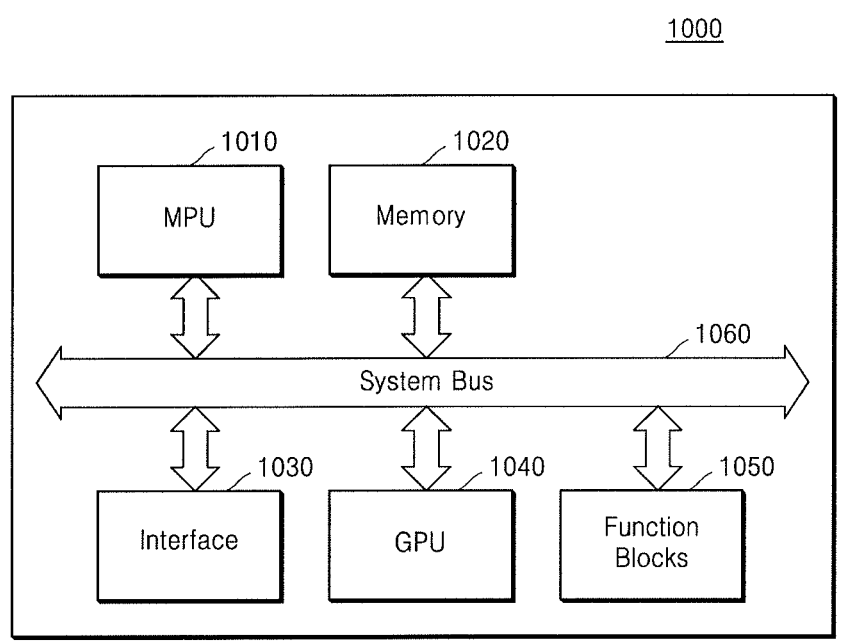
FIG. 13 illustrates a schematic block diagram of a configuration of a semiconductor package according to an example embodiment.

FIG. 13 illustrates a schematic block diagram of a configuration of a semiconductor package according to an example embodiment.

Referring to FIG. 13, a semiconductor package 1000 may include a micro-processing unit (MPU) 1010, memory 1020, an interface 1030, a graphics processing unit (GPU) 1040, functional blocks 1050, and a system bus 1060 for connecting the functional blocks 1050. The semiconductor package 1000 may include both the MPU 1010 and the GPU 1040 or only one of the MPU 1010 and the GPU 1040.

The MPU 1010 may include a core and an L2 cache. For example, the MPU 1010 may include a multicore. The respective cores of the multicore may have the same performance or different performances. The respective cores of the multicore may be simultaneously activated or may be activated at different points in time.

The memory 1020 may store a result processed by the functional blocks 1050 by control of the micro-processing unit 1010. The interface 1030 may transmit and receive information or a signal to and from external devices. The GPU 1040 may perform graphic functions. For example, the GPU 1040 may perform a video codec or may process three-dimensional (3D) graphics. The functional blocks 1050 may perform various functions. For example, when the semiconductor package 1000 is a wireless access point (AP) in a mobile device, some of the functional blocks 1050 may perform a communication function. The semiconductor package 1000 may include one of the semiconductor packages 10, 20, 30, 40, 50, and 60 according to the present example embodiment described in FIGS. 1 to 10.

By way of summation and review, in order to make electronic parts small and light, semiconductor packages mounted in the electronic parts may be formed to process high capacity data with reduced package volumes. Semiconductor chips mounted in the semiconductor packages are desired to be highly integrated and single packaged. Therefore, in order to efficiently arrange the semiconductor chips in a limited structure of the semiconductor package, a system in package is applied.

As described above, embodiments relate to a system in package including a processor chip and a memory chip. Embodiments may provide a semiconductor package capable of improving heat emission property and high density integration while efficiently arranging semiconductor chips in a limited structure of a semiconductor package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a package substrate;
a lower semiconductor chip on the package substrate;
a heat emission member on the lower semiconductor chip, the heat emission member having a horizontal unit and a vertical unit connected to the horizontal unit;
a first semiconductor chip stack and a second semiconductor chip stack on the horizontal unit; and
a molding member that surrounds the lower semiconductor chip, the first and second semiconductor chip stacks, and the heat emission member, wherein:
the vertical unit is arranged between the first semiconductor chip stack and the second semiconductor chip stack,
an upper surface of the vertical unit is exposed in the molding member, and
the horizontal unit is directly adhered to the lower semiconductor chip.

2. The semiconductor package as claimed in claim 1, wherein:
the first semiconductor chip stack includes a plurality of first semiconductor chips,
the second semiconductor chip stack includes a plurality of second semiconductor chips,
the pluralities of first and second semiconductor chips are electrically connected to the package substrate by bonding wires, and
the lower semiconductor chip is electrically connected to the package substrate by bonding bumps.

3. The semiconductor package as claimed in claim 2, wherein lowermost semiconductor chips among the pluralities of first and second semiconductor chips are adhered to the horizontal unit by an adhesive member.

4. The semiconductor package as claimed in claim 2, wherein:
the package substrate includes a ground pad, and
the heat emission member is electrically connected to the ground pad through one of the plurality of first and second semiconductor chips, or
the heat emission member is directly electrically connected to the ground pad.

5. The semiconductor package as claimed in claim 2, wherein a first width of the horizontal unit that faces a direction in which the bonding wires are formed is less than a second width of the horizontal unit in a direction in which the bonding wires are not formed.

6. The semiconductor package as claimed in claim 1, wherein the first semiconductor chip stack and the second semiconductor chip stack do not overlap each other.

7. The semiconductor package as claimed in claim 6, wherein the vertical unit is formed as one structure, and is separate from the first semiconductor chip stack and the second semiconductor chip stack.

8. The semiconductor package as claimed in claim 1, wherein the first semiconductor chip stack and the second semiconductor chip stack overlap each other at least in part.

9. The semiconductor package as claimed in claim 8, wherein the vertical unit is formed of a plurality of structures, and is separate from the first semiconductor chip stack and the second semiconductor chip stack.

10. A semiconductor package, comprising:
a package substrate;
a lower semiconductor chip on the package substrate;
a heat emission member on the lower semiconductor chip, the heat emission member having a horizontal unit and a vertical unit connected to the horizontal unit;
a first semiconductor chip stack and a second semiconductor chip stack arranged on the horizontal unit;
a molding member that surrounds the lower semiconductor chip, the first and second semiconductor chip stacks, and the heat emission member; and
an electromagnetic wave shielding member that covers a side surface of the package substrate and a surface of the molding member, wherein:
the vertical unit is arranged between the first semiconductor chip stack and the second semiconductor chip stack, and
an upper surface of the vertical unit is exposed in the molding member and contacts the electromagnetic wave shielding member.

11. The semiconductor package as claimed in claim 10, wherein:
the package substrate includes a ground pad, and
the electromagnetic wave shielding member is electrically connected to the ground pad.

12. The semiconductor package as claimed in claim 10, wherein a plane area of the horizontal unit is greater than a plane area of the lower semiconductor chip.

13. The semiconductor package as claimed in claim 10, wherein:
the first semiconductor chip stack is formed of a plurality of first semiconductor chips,
the second semiconductor chip stack is formed of a plurality of second semiconductor chips,
the pluralities of first and second semiconductor chips are connected to the package substrate by bonding wires, and
the lower semiconductor chip is connected to the package substrate by bonding bumps.

14. The semiconductor package as claimed in claim 13, wherein:
the pluralities of first and second semiconductor chips include memory chips, and
the lower semiconductor chip includes a processor chip.

15. A semiconductor package, comprising:
a package substrate;
a processor chip on the package substrate;
a heat emission member on the processor chip, the heat emission member having a horizontal unit and a vertical unit connected to the horizontal unit;
a first memory chip stack and a second memory chip stack on the heat emission member; and
a molding member that surrounds the processor chip, the first and second memory chip stacks, and the heat emission member, wherein:
the vertical unit is between the first memory chip stack and the second memory chip stack,
an upper surface of the vertical unit is exposed in the molding member,
another package substrate is not arranged between the processor chip and the first and second memory chip stacks,
thermal conductivity of a material that forms the heat emission member is greater than thermal conductivity of a material that forms the molding member, and
respective lowermost memory chips of the first memory chip stack and the second memory chip stack are adhered to the horizontal unit by an adhesive member with a thermal conductivity that is lower than that of the heat emission member.

16. The semiconductor package as claimed in claim 15, wherein:
the molding member includes an epoxy molding compound, and
the heat emission member is formed of a metal, metal paste, a metal tape, or an electrically conductive material.

17. The semiconductor package as claimed in claim 15, wherein:
the horizontal unit contacts the processor chip, and
the vertical unit is separate from the first memory chip stack and the second memory chip stack.

* * * * *